(12) United States Patent
Egawa

(10) Patent No.: US 8,085,823 B2
(45) Date of Patent: Dec. 27, 2011

(54) LASER SOURCE DEVICE, WAVELENGTH CONVERSION ELEMENT, METHOD OF MANUFACTURING WAVELENGTH CONVERSION ELEMENT, PROJECTOR, AND MONITORING DEVICE

(75) Inventor: Akira Egawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 146 days.

(21) Appl. No.: 12/496,816

(22) Filed: Jul. 2, 2009

(65) Prior Publication Data

US 2010/0002735 A1  Jan. 7, 2010

(30) Foreign Application Priority Data

Jul. 4, 2008 (JP) ................................. 2008-176244

(51) Int. Cl.
*H01S 3/10* (2006.01)

(52) U.S. Cl. ................ 372/21; 372/22; 372/27

(58) Field of Classification Search .............. 372/21, 372/22, 92, 27
See application file for complete search history.

(56) References Cited

U.S. PATENT DOCUMENTS 3,818,129 A * 6/1974 Yamamoto ................. 348/754
5,164,947 A * 11/1992 Lukas et al. ................ 372/22
5,285,258 A * 2/1994 Kamon ...................... 356/401

FOREIGN PATENT DOCUMENTS

JP 05-075196 3/1993

OTHER PUBLICATIONS

Aram Mooradian, et al "High Power Extended Vertical Cavity Surface Emitting Diode Lasers and Arrays and their Applications" Micro-Optics Conference, Tokyo Japan, Nov. 2, 2005, pp. 1-4.

* cited by examiner

*Primary Examiner* — Armando Rodriguez
(74) *Attorney, Agent, or Firm* — Workman Nydegger

(57) ABSTRACT

A laser source device includes: a light emission unit which emits laser beam having first wavelength; a first mirror which selectively reflects S-polarized light contained in the first wavelength laser beam emitted from the light emission unit in a direction different from the direction toward the light emission unit and transmits second wavelength laser beam; a second mirror which receives laser beam reflected by the first mirror and reflects laser beam having first wavelength and contained in the received laser beam toward the first mirror; and a wavelength conversion element disposed between the first mirror and the second mirror and converts at least a part of S-polarized light contained in the received first wavelength laser beam into laser beam having second wavelength.

8 Claims, 9 Drawing Sheets

LASER SOURCE DEVICE, WAVELENGTH CONVERSION ELEMENT, METHOD OF MANUFACTURING WAVELENGTH CONVERSION ELEMENT, PROJECTOR, AND MONITORING DEVICE

BACKGROUND

1. Technical Field

The present invention relates to a laser source device, a wavelength conversion element, a method of manufacturing a wavelength conversion element, a projector, and a monitoring device.

2. Related Art

Currently, many optical apparatuses such as projectors include high-pressure mercury lamp as illumination source. The high-pressure mercury lamp used in these apparatuses can provide high-output light, but has disadvantages such as limited color reproducibility, difficulty in immediate turning on, and short life. For these reasons, a laser source device is expected to be employed as a high-output light source in place of the high-pressure mercury lamp.

A laser source device including resonator and wavelength conversion element has been proposed as a high-output laser source device (see JP-A-5-75196, for example). The laser disclosed in JP-A-5-75196 (laser source device) has a laser material (active layer), a wavelength conversion element, and other components between input mirror and output coupler. When energy is supplied to the laser material from diode laser source for excitation, laser beam having fundamental wavelength is generated and reciprocates between the input mirror and the output coupler. The resonator is provided between the input mirror and the output coupler. The fundamental wavelength laser beam amplified thereat is converted into laser beam having conversion wavelength by the wavelength conversion element. The laser beam having conversion wavelength is extracted through the output coupler to obtain high-output laser beam having desired wavelength.

The laser disclosed in JP-A-5-75196 further includes a polarizing unit (Brewster plate) within the resonator. In this structure, the polarization condition of laser beam within the resonator is controlled by the polarizing unit such that laser beam having fundamental wavelength can be resonated in a preferable manner. The wavelength conversion element has polarization dependency, and thus the wavelength conversion element can provide preferable function by controlling the polarization condition of laser beam.

As discussed, the laser disclosed in JP-A-5-75196 emits high-output laser beam having desired wavelength. However, the laser still has several points to be improved in view of increasing efficiency and output.

According to the laser shown in JP-A-5-75196, the polarizing unit is disposed within the resonator, and laser beam enters the polarizing unit every time the beam reciprocates within the resonator. In this case, a part of the entering laser beam is reflected in unexpected directions due to concaves and convexes of the surface of the polarizing unit or the like, or absorbed by the polarizing unit. As a result, utilization efficiency of laser beam decreases.

For increasing output of laser beam, a plurality of laser beams emitted from a plurality of light emission units can be combined before emission. In this structure, however, arrangement of components such as the wavelength conversion elements and polarizing units provided for the respective light emission units in appropriate positions for the emission units requires considerable labors, and thus the const rises. On the other hand, in the structure having the common components such as the wavelength conversion element and polarizing unit for the plural light emission units, the positions of the components need to be determined considering polarization dependency of the wavelength conversion element. In this case, the degree of freedom for disposing the components considerably lowers, and constitution of the laser having this structure becomes difficult.

SUMMARY

It is an advantage of some aspects of the invention to provide a laser source device capable of increasing output and efficiency. It is another advantage of some aspects of the invention to provide a wavelength conversion element and its manufacturing method having considerably high degree of freedom for arrangement. It is further advantage of some aspects of the invention to provide a projector providing high-quality projection images and a monitoring device providing clear images by using high-output laser beams.

A laser source device according to a first aspect of the invention includes: a light emission unit which emits laser beam having first wavelength; a first mirror which selectively reflects S-polarized light contained in the first wavelength laser beam emitted from the light emission unit in a direction different from the direction toward the light emission unit and transmits second wavelength laser beam; a second mirror which receives laser beam reflected by the first mirror and reflects laser beam having first wavelength and contained in the received laser beam toward the first mirror; and a wavelength conversion element disposed between the first mirror and the second mirror and converts at least a part of S-polarized light with respect to the first mirror contained in the received first wavelength laser beam into laser beam having second wavelength.

According to this structure, S-polarized light having fundamental wavelength and contained in laser beam emitted from the light emission unit is reflected by the surface of the first mirror and enters the wavelength conversion element. A part of the S-polarized light having the fundamental wavelength and entering the wavelength conversion element is converted into laser beam having conversion wavelength, and the S-polarized light having fundamental wavelength and not converted is reflected by the second mirror to be bended. A part of S-polarized light having fundamental wavelength and reflected by the second mirror is converted into conversion wavelength laser beam by the wavelength conversion element, and the S-polarized light having fundamental wavelength and not converted is reflected by the first mirror and enters the light emission unit. The fundamental wavelength S-polarized light having entered the light emission unit is reflected by the reflection layer of the light emission unit and released from the light emission unit.

Thus, a resonator is provided between the light emission unit and the second mirror. Laser beam emitted from the light emission unit is resonated and amplified, and a part of fundamental wavelength laser beam thus amplified is converted into conversion wavelength laser beam every time the part of the laser beam passes the wavelength conversion element. The conversion wavelength laser beam is extracted by passing through the first mirror, and is extracted by passing through the second mirror having similar characteristics as those of the first mirror. Accordingly, high-output laser beams having desired wavelength can be obtained according to this aspect of the invention.

The wavelength conversion element converts wavelength of at least a part of S-polarized light supplied to the first mirror, and S-polarized light supplied to the first mirror is selectively reflected by the surface of the first mirror and enters the wavelength conversion element. Thus, polarized light entering the wavelength conversion element is matched with polarization dependency of the wavelength conversion element. As a result, the necessity for controlling the polarization condition of laser beam entering the wavelength conversion element using a polarizing unit such as Brewster plate is eliminated, and the number of components through which laser beam passes within the resonator is reduced by elimination of the polarizing unit such as Brewster plate. Accordingly, loss of laser beam caused by reflection of laser beam reciprocating within the resonator on the surface of these components in unexpected directions or absorption by the components is prevented, and thus the efficiency of the laser source device improves.

It is difficult to design a light separation unit such as the first mirror such that P-polarized light contained in received light and supplied to the light separation unit can be selectively reflected by the light separation unit. Since P-polarized light is difficult to be extracted as reflection light, P-polarized light having passed through the light separation unit is used when resonation of P-polarized light is desired. In this case, the P-polarized light passes through the light separation unit every time the P-polarized light reciprocates within the resonator, and therefore passes the surface of the light separation unit twice in the going route or the returning route. Thus, the occasions of unexpected reflection of the P-polarized light on the surface and absorption of the P-polarized light by the light separation unit increase, and light utilization efficiency lowers.

According to this aspect of the invention, however, S-polarized light supplied to the first mirror is resonated. Thus, the S-polarized light having fundamental wavelength and reciprocating within the resonator reflects only once on the surface (boundary surface) of the first mirror in the going route or the returning route. Thus, light utilization efficiency becomes considerably higher than that in case of P-polarized light, and the efficiency of the laser source device improves.

It is preferable that the first mirror, the second mirror, and the wavelength conversion element are provided as common units for a plurality of the arranged light emission units. The optical axis directions of laser beams emitted from the plural light emission units are disposed parallel with the surface of the first mirror.

When the plural emission units are provided, the total output of laser beams obtained from the laser source device increases. When the optical axis directions of laser beams emitted from the plural light emission units are parallel with the surface, the distances between the first mirror and the plural light emission units and the distance between the first mirror and the wavelength conversion element can be reduced as will be described later in detail. That is, the optical path lengths between the plural light emission units and the wavelength conversion element can be reduced by the size reduction of the first mirror compared with a structure including a plurality of light emission units disposed in a direction not parallel with the first mirror. In this structure, the proportion of the optical path length within the wavelength conversion element occupying in the optical path length within the resonator increases, and thus laser beam having fundamental wavelength can be efficiently converted into laser beam having conversion wavelength.

It is preferable that the wavelength conversion element includes a plurality of wavelength conversion element pieces having polarization inversion axis and containing cyclic polarization inverted structure in a cyclic direction orthogonal to the polarization inversion axis. In this case, the wavelength conversion element pieces are affixed to one another in a direction along the polarization inversion axis. The polarization inversion axis is disposed parallel with the oscillation direction of the S-polarized light.

Generally, a wavelength conversion element converts polarized light oscillating in a direction parallel with the polarization inversion axis of the wavelength conversion element and traveling in the predetermined alternate arrangement direction of polarized parts and inverted parts. According to this structure, the length of the wavelength conversion element in the direction of the polarization inversion axis can be easily controlled by varying the number of the wavelength conversion element pieces affixed to one another. Thus, the number of the light emission units disposed in parallel with the polarization inversion axis can be easily increased.

It is preferable that the wavelength conversion element is produced by affixing the plural wavelength conversion element pieces to one another via spacers. In this case, it is preferable that the linear expansion coefficient of the plural wavelength conversion element pieces of the wavelength conversion element is substantially equal to the linear expansion coefficient of the spacers of the wavelength conversion element, and that the thermal conductivity of the spacers is equal to or larger than the thermal conductivity of the plural wavelength conversion element pieces. It is further preferable that the spacers are made of the same material as that of the plural wavelength conversion element pieces.

In this structure, the wavelength conversion element having the spacers between parts receiving laser beams functions similarly to a structure not having spacers. Since the spacers do not require wavelength conversion function, the length of the wavelength conversion element can be easily increased in the polarization inversion axis direction by providing the spacers.

When the linear expansion coefficient of the plural wavelength conversion element pieces is substantially equal to the linear expansion coefficient of the spacers, thermal contractions of the wavelength conversion element pieces and of the spacers become uniform. Thus, distortion of the wavelength conversion element caused by heat and separation between the wavelength conversion element pieces and the spacers caused by heat are prevented. When the thermal conductivity of the spacers is equal to or larger than that of the plural wavelength conversion element pieces, the temperatures of the plural wavelength conversion element pieces are more equalized than those of a structure containing no spacer. Thus, the characteristics of the plural wavelength conversion element pieces for converting wavelength are equalized.

When the spacers are made of the same material as that of the plural wavelength conversion element pieces, mechanical characteristics of the spacers and the wavelength conversion element pieces such as the linear expansion coefficients and the thermal conductivities are equalized. Since the spacers do not require polarized parts nor inverted parts as discussed above, the spacers have a crystal structure different from that of the wavelength conversion element pieces by reduction of the polarized parts and the inverted parts. Thus, equalization of the mechanical characteristics of the wavelength conversion element and elongation of the wavelength conversion element in the polarization inversion axis direction can be easily achieved.

It is preferable that a reinforcing member is provided on the outer side of the wavelength conversion element piece disposed at the outermost position in the polarization inversion axis direction, and that the surfaces of the plural wavelength conversion element pieces orthogonal to the predetermined direction and the surface of the reinforcing member orthogonal to the predetermined direction are collectively polished.

When the surfaces of the plural wavelength conversion element pieces orthogonal to the predetermined direction are polished, the surface accuracy of these surfaces increases. Thus, lowering of utilization efficiency of light caused by reflection or bending of the light in unexpected directions while the light is passing through the surfaces can be prevented. Generally, the end surfaces to be polished are often excessively polished. However, excessive polish on the wavelength conversion element piece disposed at the outermost position can be prevented when the reinforcing member is provided on the outer side of the wavelength conversion element piece disposed at the outermost position in the polarization inversion axis direction.

A wavelength conversion element according to a second aspect of the invention includes a plurality of wavelength conversion element pieces having polarization inversion axis and containing cyclic polarization inverted structure in a cyclic direction orthogonal to the polarization inversion axis. The wavelength conversion element pieces are affixed to one another in a direction along the polarization inversion axis to form the wavelength conversion element.

Generally, a wavelength conversion element converts wavelength of polarized light oscillating in a direction parallel with the polarization inversion axis of the wavelength conversion element and traveling in the cyclic direction. According to this structure, the length of the wavelength conversion element in the polarization inversion axis direction can be easily controlled by varying the number of the wavelength conversion element pieces affixed to one another. Thus, the degree of freedom for disposing the wavelength conversion element and the part emitting light toward the wavelength conversion element increases, and the applicability of the wavelength conversion element to optical systems disposed at various positions improves.

A method of manufacturing a wavelength conversion element according to a third aspect of the invention includes: preparing a base material having polarization inversion axis parallel with a thickness direction of the base material and containing cyclic polarization inverted structure in a cyclic direction orthogonal to the polarization inversion axis; cutting the base material in the thickness direction along the cyclic direction to form a plurality of wavelength conversion element pieces; and affixing the plural wavelength conversion element pieces in a direction along the polarization inversion axis. The method produces a wavelength conversion element by affixing the plural wavelength conversion element pieces.

According to this method, the length of the wavelength conversion element in the polarization inversion axis direction becomes a length corresponding to the number of the wavelength conversion element pieces affixed to one another. Thus, the wavelength conversion element having a desired length in the polarization inversion axis direction can be produced by controlling the number of the attached wavelength conversion element pieces.

A method of manufacturing a wavelength conversion element according to a fourth aspect of the invention includes: preparing a plurality of base materials having polarization inversion axes parallel with thickness directions of the base materials and containing cyclic polarization inverted structures in cyclic directions orthogonal to the polarization inversion axes; equalizing the cyclic directions of the plural base materials and affixing the plural base materials in directions along the polarization inversion axes; and cutting the plural affixed base materials in the thickness direction along the cyclic direction. The method produces a wavelength conversion element having a plurality of wavelength conversion element pieces affixed to one another by cutting the plural base materials.

According to this method, the length of a structure constituted by the affixed plural base materials becomes a length in the polarization inversion axis direction corresponding to the number of the base materials affixed to one another. By cutting the structure along the thickness direction of the base materials, the wavelength conversion element having a length in the polarization inversion axis direction corresponding to the number of the attached base materials. Thus, the wavelength conversion element having a desired length in the polarization inversion axis direction can be produced by controlling the number of the attached base materials.

A projector according to a fifth aspect of the invention includes: the laser beams source device described above; a light modulation device which modulates laser beam emitted from the laser source device; and a projection device which projects laser beam modulated by the light modulation device.

In this structure, high-output laser beams can be produced from the laser source device according to the above aspect of the invention. Thus, high-output laser beams are modulated by the light modulation device and then projected by the projection device in the projector. Accordingly, the projector produces high-luminance and high-quality projection images having a wide dynamic range. Moreover, the projector which includes the laser source device having high efficiency only requires low power consumption.

A monitoring device according to a sixth aspect of the invention includes: the laser source device described above; and an image pickup device which obtains an image of a subject illuminated by the laser source device.

In this structure, the subject can be illuminated by high-output laser beams emitted from the laser source device according to the above aspect of the invention. Thus, the monitoring device obtains a sufficient amount of light reflected by the subject, and thus becomes a preferable monitoring device capable of providing clear images of the subject using the sufficient light amount. Moreover, the monitoring device which includes the laser source device having high efficiency according to the above aspect of the invention only requires low power consumption.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments according to the invention are hereinafter described. A laser source device (first and second embodiments) is initially discussed, and then a wavelength conversion element (third embodiment), a method of manufacturing the wavelength conversion element (fourth and fifth embodiments), a projector, and a monitoring device are sequentially explained. The technical scope of the invention is not limited to the embodiments described herein, but modifications and changes may be made without departing from the scope and spirit of the invention. Example structures shown in the figures have sizes and reduction scales different from those of the practical structures for easy understanding of the characteristic parts of the structures in some cases.

First Embodiment

Figure 1:
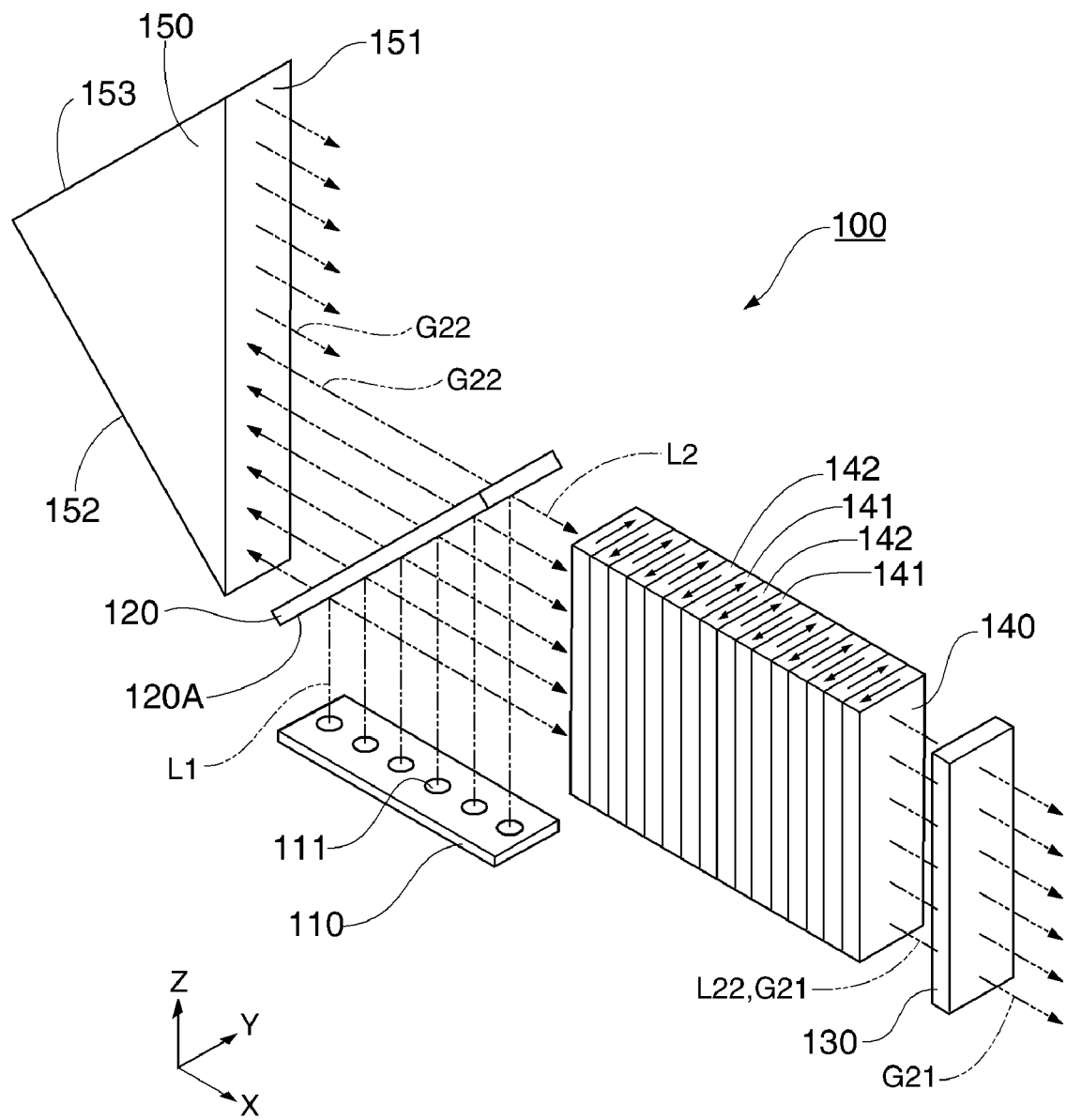
FIG. 1 is a perspective view illustrating a general structure of a laser source device according to a first embodiment.

FIG. 1 is a perspective view showing a general structure of a laser source device according to the first embodiment. As illustrated in FIG. 1, a laser source device 100 includes a laser element 110 having a plurality of arranged emitters (light emission units) 111, a first mirror 120, a second mirror 130, and a wavelength conversion element 140. A part of light emitted from the emitters 111 is reflected by the first mirror 120 and supplied to the second mirror 130 via the wavelength conversion element 140. A part of the light supplied to the second mirror 130 is reflected by the second mirror 130 and supplied to the first mirror 120 via the wavelength conversion element 140. A part of the light supplied to the first mirror 120 is reflected by the first mirror 120 and enters the emitters 111. The light not reflected by the first mirror 120 travels through the first mirror 120 and enters an optical axis conversion prism 150, from which the light is released after its optical axis is bended.

The positional relationship between components is now explained based on XYZ orthogonal coordinate system shown in FIG. 1. In the XYZ orthogonal coordinate system, the direction where the first mirror 120, the wavelength conversion element 140, and the second mirror 130 are disposed corresponds to X direction, the optical axis direction of light emitted from the emitters 111 corresponds to Z direction, and the direction orthogonal to the X direction and Z direction corresponds to Y direction.

The laser element 110 has a substrate and the plural (six in the figure) emitters 111 disposed on the substrate. In this embodiment, the emitters 111 are arranged in the X direction. Though detailed structure is not shown, each of the emitters 111 has a DBR layer (reflection layer) disposed on the substrate, and an active layer disposed on the DBR layer (Z direction) and emitting light. The DBR layer is provided on the side opposite to the light emission surface of the active layer. The emitters 111 in this embodiment emit laser beams having fundamental wavelength (infrared laser beams having wavelength of 1,064 nm in this example) by resonating lights emitted from the active layer within the emitters 111 to provide laser oscillation.

The first mirror 120 has a surface 120A having both polarized light separation characteristics and wavelength selection characteristics and facing the laser element 110. The angle formed by the normal line direction of the surface 120A and the optical axes of infrared laser beams L1 emitted from the emitters 111 (Z direction) is 45 degrees such that the normal line direction of the surface 120A is not parallel with arrangement direction of the emitters 111 (X direction). In this example, the surface 120A has a dichroic mirror film which transmits laser beams having conversion wavelength (described later) and selectively reflects S-polarized light contained in fundamental wavelength laser beams (infrared laser beams in this example) and supplied to the surface 120A. In this structure, light intensity of S-polarized light contained in the infrared laser beams reflected by the surface 120A becomes higher than light intensity of P-polarized light. Since reflectance of P-polarized light is generally lower than that of S-polarized light, the light intensity of S-polarized light contained in the reflected light can be easily raised higher than that of P-polarized light.

In the following explanation, S-polarized light supplied to the surface of the first mirror is simply referred to as S-polarized light, and P-polarized light supplied to the surface of the first mirror is simply referred to as P-polarized light in some cases. That is, according to the structure in this embodiment, polarized light component oscillating in the Y direction on the optical path between the laser element 110 and the second mirror 130 corresponds to S-polarized light.

The wavelength conversion element 140 is constituted by PPLN (periodically poled lithium niobate) as non-linear optical crystal, for example, and functions as SHG which converts a part of received laser beams into lights having approximately half wavelength to generate secondary higher harmonic waves. The polarization inversion axis direction (crystal direction) of the wavelength conversion element 140 is parallel with the oscillation direction of S-polarized light (Y direction). The wavelength conversion element 140 has a cyclic structure having polarized parts 141 and inverted parts 142 disposed alternately and cyclically. In this embodiment, the cyclic direction of the polarized parts 141 and the inverted parts 142 cyclically arranged corresponds to the X direction.

In FIGS. 1 through 7, the polarization direction and inversion direction of the wavelength conversion element and other components are indicated by arrows.

The traveling directions of S-polarized lights L2 reflected by the surface 120A correspond to the cyclic direction. At least a part of the S-polarized lights L2 having entered the wavelength conversion element 140 is converted into laser beam having conversion wavelength (green laser beam G21 having wavelength of 532 nm in this example). Infrared laser beams L22 and green laser beams G21 not converted by the wavelength conversion element 140 are supplied toward the second mirror 130.

The second mirror 130 has wavelength selectivity which selectively transmits or reflects components of received light for each wavelength. In this embodiment, the second mirror 130 is constituted by volume holographic diffraction grating (hereinafter abbreviated as VHG) which reflects the infrared laser beams L22 and transmits the green laser beams G21. The second mirror 130 is not limited to the structure constituted by VHG but may be a structure having dichroic mirror film or the like. For example, the second mirror 130 may have a dichroic mirror film on its surface facing the wavelength conversion element 140.

The green laser beams G21 having passed the second mirror 130 are extracted to the outside. The infrared laser beams L22 are reflected by the second mirror 130 and bended through 180° to again enter the wavelength conversion element 140. Apart of the infrared laser beams entering the wavelength conversion element 140 from the second mirror 130 is also converted into the green laser beams G22 and released toward the first mirror 120. The infrared laser beams not converted are reflected by the surface 120A and enter the emitters 111. The infrared laser beams having entered the emitters 111 are reflected by the DBR layers and released from the emitters 111 toward the surface 120A of the first mirror 120.

The green laser beams G22 having passed the first mirror 120 enter the optical axis conversion prism 150. The optical axis conversion prism 150 is a triangle-pole-shaped prism having a substantially right-angled isosceles triangle cross section. A surface 151 having hypotenuse of the right-angled isosceles triangle included in three side surfaces 151, 152, and 153 of the optical axis conversion prism 150 crosses the optical axes of the green laser beams G22 passing the first mirror 120 at right angles. The green laser beams G22 having passed the surface 151 are sequentially reflected by the inner sides of the remaining two side surfaces 152 and 153 of the optical axis conversion prism 150. Thus, the traveling directions of the green laser beams G22 are changed through 90° for each reflection, and then released through the surface 151 and extracted to the outside.

According to this structure, infrared laser beams emitted from the emitters 111 reciprocate many times between the emitters 111 and the second mirror 130 to be resonated and amplified. A part of the infrared laser beams thus amplified are converted into green laser beams every time the infrared laser beams pass the wavelength conversion element 140. The green laser beams thus converted pass the first mirror 120 and the optical axis conversion prism 150 or pass the second mirror 130 so as to be extracted to the outside. By this method, the laser source device 100 can provide high-output laser beams amplified by resonation. Moreover, laser beams converted by the wavelength conversion element 140 have desired wavelength. Furthermore, the polarization condition of fundamental wavelength laser beams (S-polarized light) entering the wavelength conversion element 140 is matched with the polarization dependency of the wavelength conversion element 140. Thus, the fundamental laser beam can be efficiently converted into conversion wavelength laser beams.

In the structure which selectively reflects S-polarized light by the first mirror 120, the proportion of S-polarized light in the infrared laser beams passing between the first mirror 120 and the second mirror 130 becomes higher than that of P-polarized light. In this case, infrared laser beams passing between the first mirror 120 and the second mirror 130 easily interfere with one another, and the gain of amplification considerably increases. As a result, considerably high output green laser beams can be obtained.

In the structure which selectively reflects S-polarized light by the first mirror 120, a polarizing unit such as Brewster plate for controlling the polarization condition of laser beams passing between the first mirror 120 and the second mirror 130 is not required. Thus, a part of laser beams supplied to the Brewster plate is not reflected in unexpected directions due to small concaves and convexes on the surface of the Brewster plate nor absorbed by the Brewster plate, for example, and thus utilization efficiency of light can be improved. Moreover, resonated S-polarized light can be easily utilized as reflection light than resonated P-polarized light, and thus the structure of the laser source device can be simplified. When an optical component (such as first mirror 120) is disposed on the optical path within the resonator to resonate light transmitted through the optical component (such as P-polarized light), laser beams pass the optical component for both of going and returning routes on the optical path within the resonator. More specifically, in resonating transmission light, two surfaces of the optical component exist on the optical path of laser beams for the going or returning routes. On the other hand, only one surface of the optical component exists in resonating reflection light. Thus, decrease in light utilization efficiency caused by reflection of laser beams on the surface of the component in unexpected directions can be considerably reduced.

It is possible to provide a band-pass filter on the optical path between the laser element 110 and the second mirror 130 such as between the laser element 110 and the first mirror 120, between the first mirror 120 and the wavelength conversion element 140, and between the wavelength conversion element 140 and the second mirror 130. In this structure, the band of laser beams passing between the laser element 110 and the second mirror 130 can be narrowed, and thus the laser beams can be easily resonated.

The first mirror may include a polarized light separation unit such as polarized beam splitter film and wire grid as well. In this structure, the P-polarized light reflectance and S-polarized light reflectance of the first mirror can be controlled. For example, in case of utilizing a light separation film having dichroic mirror film and polarized beam splitter film laminated on a transparent substrate in this order from the transparent substrate side as the surface of the first mirror, most of S-polarized light supplied to the first mirror is reflected by the surface, and most of P-polarized light is transmitted through the surface. As a result, the polarization directions of laser beams passing between the first mirror and the second mirror are equalized, and thus the laser beams are easily resonated by easily interfering with one another.

Second Embodiment

Figure 2:
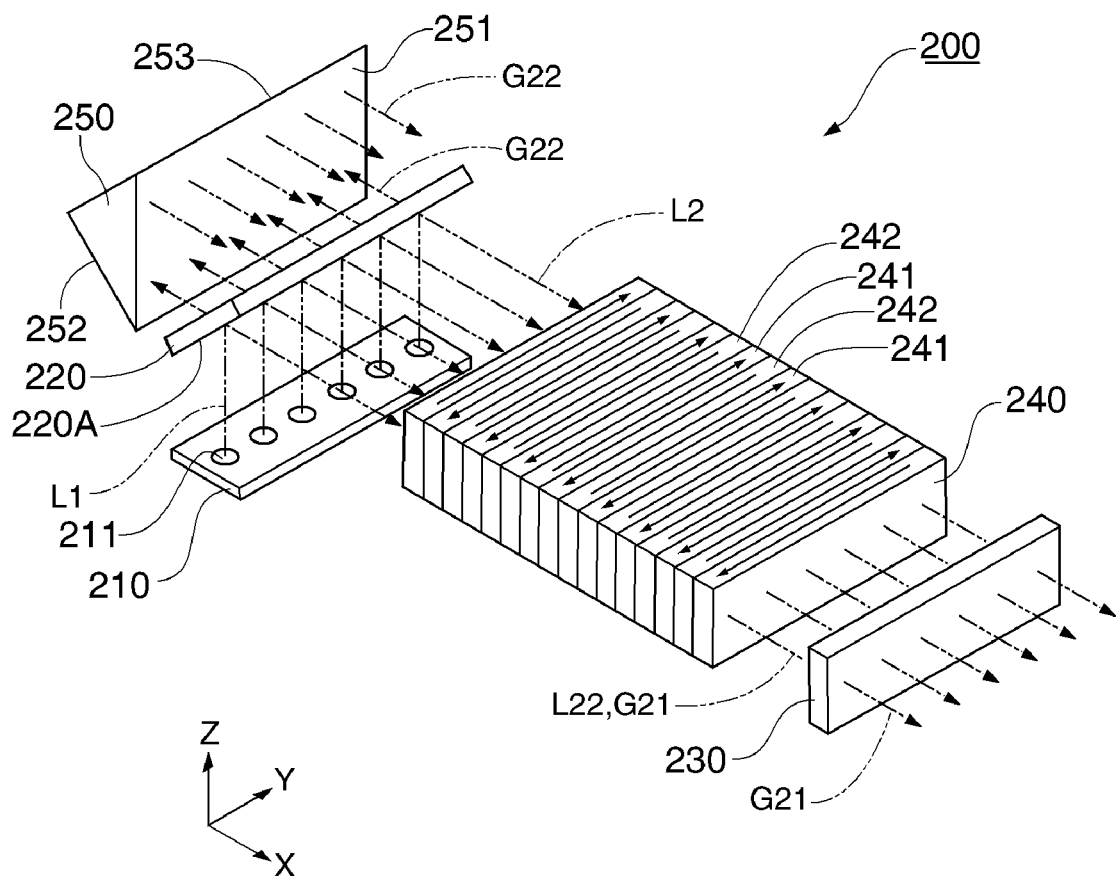
FIG. 2 is a perspective view illustrating a general structure of a laser source device according to a second embodiment.

FIG. 2 is a perspective view illustrating a general structure of a laser source device according to a second embodiment. As illustrated in FIG. 2, a laser source device 200 includes a laser element 210, a first mirror 220, a second mirror 230, a wavelength conversion element 240, and an optical axis conversion prism 250 similarly to the laser source device 100 in the first embodiment. The laser source device 200 is different from the laser source device 100 of the first embodiment in that the optical axis directions of the infrared laser beams L1 emitted from a plurality of emitters 211 (Y direction) are parallel with the first mirror 220. According to this structure, a plurality of S-polarized lights L2 contained in the plural infrared beams L1 and supplied to a surface 220A of the first mirror 220 are reflected by the surface 220A, and enter the wavelength conversion element 240 after traveling in parallel in the Y direction.

The wavelength conversion element 240 corresponds to the wavelength conversion element according to the invention, and the polarization inversion axis of the wavelength conversion element 240 is disposed parallel with the Y direction. The length of the wavelength conversion element according to the invention in the polarization inversion axis direction (Y direction) can be arbitrarily determined as will be described later in detail. Generally, a wavelength conversion element is a component for converting wavelength of polarized light which oscillates in the polarization inversion direction. Since the length of the wavelength conversion element according to the invention in the polarization inversion axis direction is arbitrarily determined, the number of laser beams arranged in parallel in the polarization inversion axis direction and supplied to the wavelength conversion element can be easily increased. Accordingly, the degree of freedom for disposing the plural emitters 211 improves, and the optical axis directions of the infrared laser beams L1 can be easily disposed parallel with the first mirror 220.

According to the laser source device 200 in the second embodiment, the optical axis directions of the infrared laser beams L1 emitted from the plural emitters 211 (Y direction) are parallel with the first mirror 220. Thus, the optical path length between the plural emitters 211 and the wavelength conversion element 240 can be reduced. More specifically, the portions of the first mirror 220 for receiving the plural infrared laser beams L1 are distributed along the optical axis directions of the infrared laser beams L1 (Y direction). That is, the portions receiving the plural infrared laser beams L1 overlap both in the X direction and Z direction. Thus, the first mirror 220 is only required to have sufficient length for receiving laser beam emitted from one emitter 211 in the X direction and Z direction. Thus, the length of the first mirror 220 in the X direction and Y direction can be reduced to the minimum, and the space between the first mirror 220 and the plural emitters 211 and the space between the first mirror 220 and the wavelength conversion element 240 can be decreased. As a result, the optical path length between the plural emitters 211 and the second mirror 230 (resonator length) becomes small, and the relative proportion of the optical path length within the wavelength conversion element 240 occupied in the resonator length increases. Generally, wavelength conversion efficiency of a wavelength conversion element increases as its optical path length becomes larger. Thus, fundamental wavelength laser beams can be converted into conversion wavelength laser beams with high efficiency.

The distances between the plural emitters and the first mirror in the laser element may be different for each of the plural emitters. For example, the emitters may be disposed on the upper step and lower step of a substrate having a step. In this case, the same advantages as those described above can be provided as long as the optical axes of laser beams emitted from the plural emitters are parallel with the first mirror.

The plural emitters may be arranged two-dimensionally in the X and Y directions. For example, the plural emitters may be disposed in the Y direction as in the second embodiment, and the plural emitters may also be arranged in the X direction in matrix shape.

Third Embodiment

Figure 3:
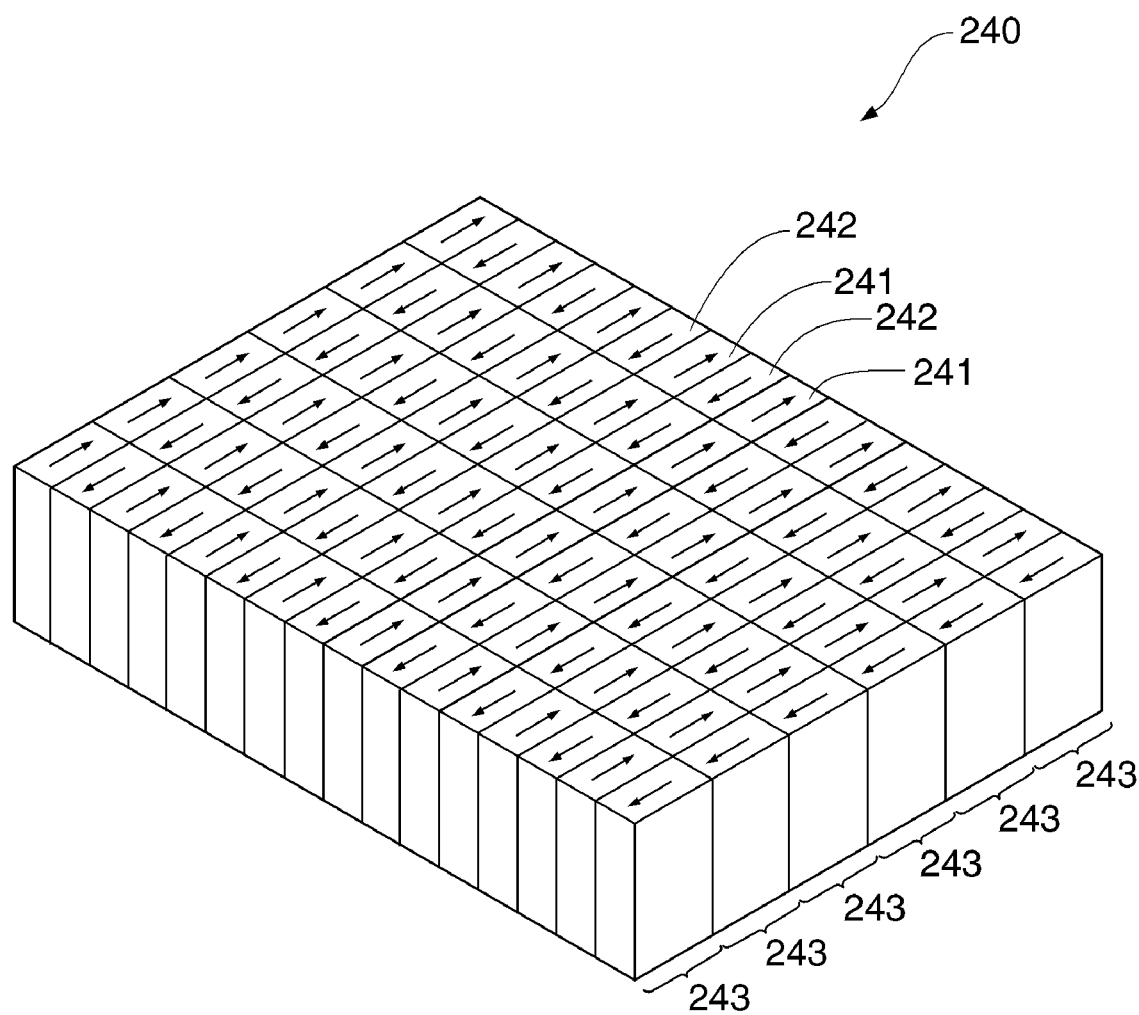
FIG. 3 is a perspective view illustrating a general structure of a wavelength conversion element according to a third embodiment.

FIG. 3 is a perspective view illustrating a wavelength conversion element according to an embodiment of the invention. This embodiment is discussed based on the wavelength conversion element 240 of the laser source device 200 in the second embodiment. FIG. 3 shows the XYZ orthogonal coordinate system corresponding to that of the second embodiment (FIG. 2) for easy understanding of the third embodiment. In the XYZ orthogonal coordinate system, the traveling direction of polarized light whose wavelength is to be converted by the wavelength conversion element 240 corresponds to the X direction, and the oscillation direction of the polarized light to be converted corresponds to the Y direction.

As shown in FIG. 3, the wavelength conversion element 240 has a plurality of (six in the figure) wavelength conversion element pieces 243 affixed to one another and arranged in the Y direction. Each of the wavelength conversion element pieces 243 of the wavelength conversion element 240 can convert wavelength of one, two or more laser beams.

Each of the wavelength conversion element pieces 243 has polarization inversion axis parallel with the Y direction, and has cyclic structure containing polarized parts 241 and inverted parts 242 alternately and cyclically. The cyclic direction where the polarized parts 241 and the inverted parts 242 are cyclically arranged corresponds to one direction (X direction in this example) orthogonal to the polarization inversion axis.

A typical wavelength conversion element is produced by partially (such as in the shape of stripes) applying electric field to abase material constituted by ferroelectric substance and having equalized crystal directions. The parts to which electric field is applied become inverted parts whose crystal structures have been changed, and parts to which electric field is not applied become polarized parts whose crystal structures have not been changed. In this structure, the positional accuracy of the inverted parts increases by reducing the thickness of the base material in the direction of applying electric field, which improves the characteristics of the wavelength conversion element. In this case, the direction of applying electric field corresponds to the polarization inversion axis direction, and thus the length of the wavelength conversion element in the polarization inversion axis direction decreases by reduction of the thickness of the base material in this direction. It is therefore required to reduce each space between laser beams, that is, each space between the emitters so as to supply plural laser beams in the polarization inversion axis direction. This requirement imposes limitation on the number of the emitters and raises the cost due to necessity for positional accuracy of the emitters, for example.

According to the wavelength conversion element in this embodiment, the length in the polarization inversion axis direction can be arbitrarily determined by increasing the number of the wavelength conversion element pieces 243 to be affixed. Thus, a desired number of laser beams can be supplied in the polarization inversion axis direction for wavelength conversion, and the limitation imposed on the interval and number of the emitters can be considerably reduced. Accordingly, the degree of freedom for disposing the emitters and the wavelength conversion element 240 improves, and the laser source device in this embodiment becomes a preferable device such as the laser source device in the second embodiment.

According to the third embodiment, the respective phases of the cyclic structures of the plural wavelength conversion element pieces 243 are equalized, that is, the positions of the respective polarized parts 241 and the inverted parts 242 are aligned as illustrated in the figure. However, the phases of the cyclic structures may be shifted. The characteristics of the plural wavelength conversion element pieces 243 are equalized when the optical path length in the wavelength conversion element 240, that is, the lengths of the plural wavelength conversion element pieces 243 are equalized in the cyclic direction (X direction).

While the wavelength conversion element 240 chiefly includes the plural wavelength conversion element pieces 243 in this embodiment, the wavelength conversion element 240 may have spacer and reinforcing member as well. This structure will be described in detail in the following modified examples 1 and 2.

Modified Examples

Figure 4A:
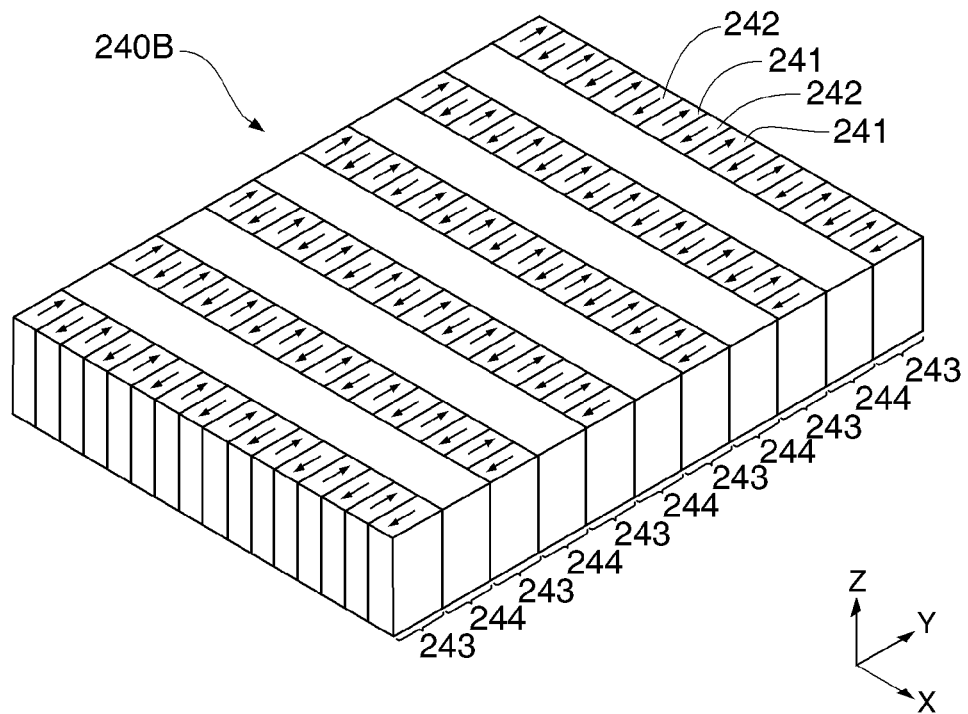
FIGS. 4A and 4B are perspective views illustrating wavelength conversion elements according to modified examples 1 and 2, respectively.
Figure 4B:
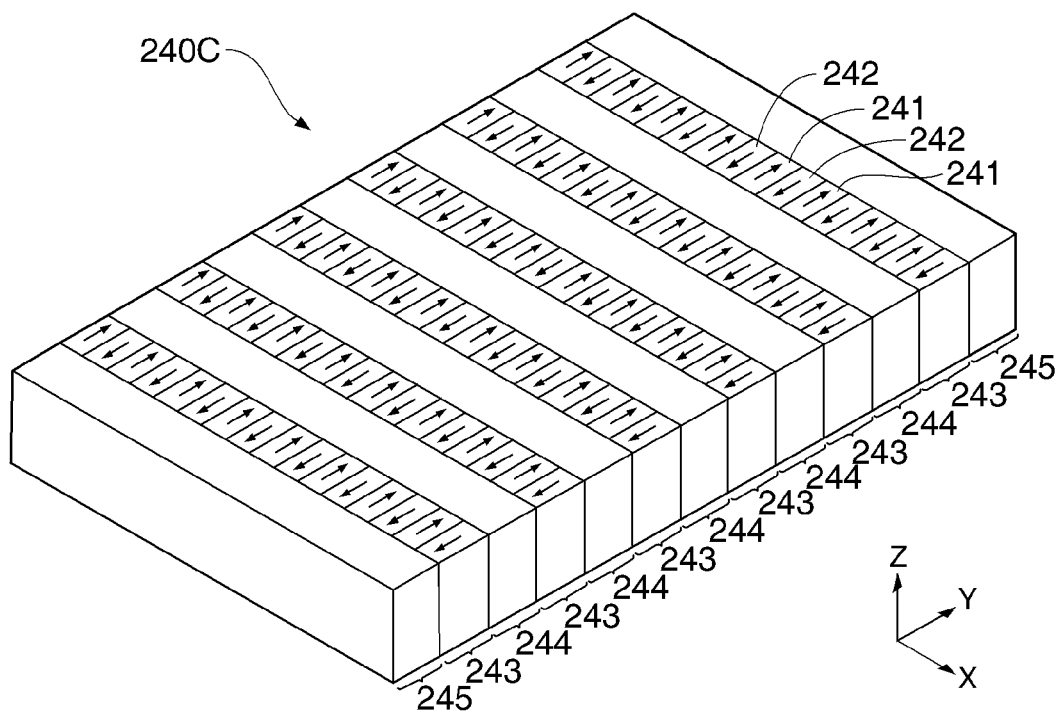

FIGS. 4A and 4B are perspective views showing wavelength conversion elements according to the modified examples 1 and 2. The modified example 1 is different from the third embodiment in that wavelength conversion element pieces are affixed to one another via spacers. The modified example 2 is different from the modified example 1 in that reinforcing members are provided on the outer sides of the wavelength conversion element pieces disposed at the outermost positions in the polarization inversion axis direction.

As illustrated in FIG. 4A, a plurality of (six in the figure) the wavelength conversion element pieces 243 of a wavelength conversion element 240B in the modified example 1 are affixed to one another via spacers 244, and each of the wavelength conversion element pieces 243 functions as a part which receives laser beam whose wavelength is to be converted. The spacers 244 according to the modified example 1 have linear expansion coefficient equivalent to that of the wavelength conversion element pieces 243, and thermal conductivity equal to or higher than that of the wavelength conversion element pieces 243. In this example, the spaces 244 are made of the same material as that of the wavelength conversion element pieces 243 but have no inverted part 242 to obtain crystal structure different from that of the wavelength conversion element pieces 243. By using the same material as in this example, the linear expansion coefficients and the thermal conductivities of the wavelength conversion element pieces 243 and the spacers 244 can be equalized, for example.

According to the modified example 1, the length of the wavelength conversion element 240B can be increased in the polarization inversion axis direction of the wavelength conversion element pieces 243 by the length of the spacers 244, and thus the degree of freedom for disposing the emitters and the wavelength conversion element 240B increases for the same reason as that of the third embodiment. Moreover, no wavelength conversion function is required for the spacers 244, and no limitation to length or the like produced by electric field applied at the time of production of the polarized parts is imposed on the spacers 244, for example. Thus, the length of the wavelength conversion element 240B can be easily increased in the polarization inversion axis direction, and the spacers 244 can be produced at lower cost than that of the wavelength conversion element pieces 243. Accordingly, the wavelength conversion element 240B can be manufactured at low cost.

The thermal deformation of the wavelength conversion element 240B becomes uniform due to equal linear expansion coefficients of the wavelength conversion element pieces 243 and the spacers 244. Moreover, partial temperature variations of the wavelength conversion element 240B become equivalent or smaller than those of a structure including no spacers 244 due to the heat conductivity of the spacers 244 equal to or higher than that of the wavelength conversion element pieces 243.

Generally, a wavelength conversion element changes its characteristics according to temperature, and is therefore used under temperature control. Since the thermal deformation of the wavelength conversion element 240B is uniform as discussed above, non-uniform thermal deformation of the wavelength conversion element 240B during use is prevented. Thus, change of characteristics of the wavelength conversion element 240B and separation between the wavelength conversion element pieces 243 and the spacers 244 caused by distortion of the polarization inversion axis are prevented.

Since the wavelength conversion element pieces 243 and the spacers 244 are made of the same material, the linear expansion coefficient and the thermal conductivity of the wavelength conversion element 240B can be easily equalized. Spacers which do not have the inverted parts 242 nor the polarized parts 241 to have a crystal structure different from that of the wavelength conversion element pieces 243 may be used.

As illustrated in FIG. 4B, a wavelength conversion element 240C in the modified example 2 has a plurality of (six in the figure) the wavelength conversion element pieces 243 affixed to one another via the spacers 244, and reinforcing members 245 are provided on the outer sides of the wavelength conversion element pieces 243 disposed at the outermost positions in the polarization inversion axis direction. The linear expansion coefficient of the reinforcing members 245 is approximately equal to that of the wavelength conversion element pieces 243. In this example, the reinforcing members 245 are formed from the same material as the spacers 244. Both ends of the wavelength conversion element 240C in the cyclic direction including the wavelength conversion element pieces 243, the spacers 244, and the reinforcing members 245 are collectively polished so as to obtain level surfaces.

Since both ends of the wavelength conversion element 240C in the cyclic direction in the modified example 2 are polished to have level surfaces, reflection or refraction of laser beams passing through these surfaces in unexpected directions due to concaves and convexes on the surface of the wavelength conversion element 240C can be reduced. Moreover, the lengths of the plural wavelength conversion element pieces 243 in the X direction are equalized by polishing, and the optical path lengths of the plural wavelength conversion element pieces 243 are thus equalized. As a result, the characteristics of the plural wavelength conversion element pieces 243 for converting wavelength become uniform. In typical polishing process, the ends of surfaces to be processed are often excessively polished. However, the wavelength conversion element pieces 243 disposed at the ends of the surfaces to be processed are not excessively polished due to the presence of the reinforcing members 245 on the outer sides of the wavelength conversion element pieces 243 disposed at the outermost positions.

Fourth Embodiment

FIGS. 5A through 5E and FIGS. 6A through 6C show steps of a method for manufacturing the wavelength conversion element according to the invention. In this embodiment, a manufacturing method of the wavelength conversion element 240 in the third embodiment is explained.

In this embodiment, a base material having polarization inversion axis parallel with the thickness direction and including a cyclic polarization inversion structure in the cyclic direction orthogonal to the polarization inversion axis is initially prepared. This base material may be a manufactured material available on the market, or may be formed individually. In this embodiment, a base material is formed for producing the wavelength conversion element. For example, the following method is employed for forming the base material.

Figure 5A:
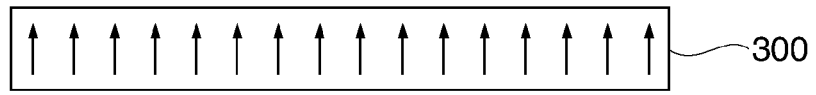
FIGS. 5A through 5E show steps of a manufacturing method according to a fourth embodiment.

Initially, a wafer 300 formed by pull method or other methods and having equalized crystal directions is prepared as shown in FIG. 5A. Then, the thickness of the wafer 300 is reduced to such an extent that electric field can be uniformly applied to the wafer 300 in the thickness direction.

Figure 5B:
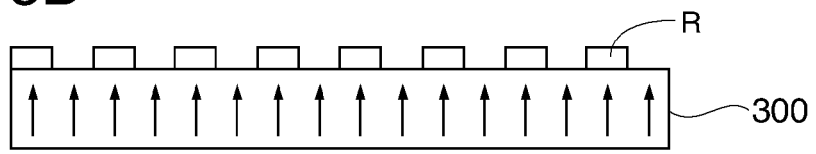

Resist patterns R in the shape of stripes are formed on the wafer 300 as shown in FIG. 5B. The portion covered with the resist patterns R will become the polarized portions 241, and the portion not covered with the resist patterns R will become the inverted portions 242.

Figure 5C:
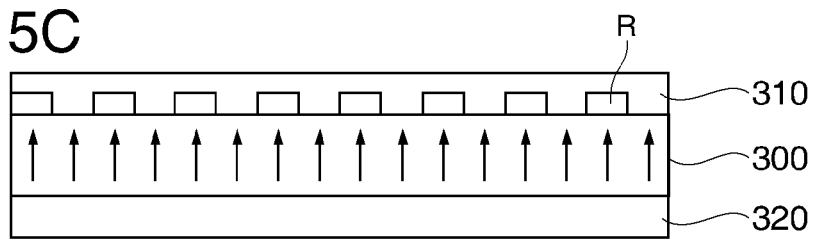

An electrode film 310 covering the wafer 300 and the resist patterns R, and an electrode film 320 covering the surface of the wafer 300 opposite to the surface having the resist patterns R are provided as shown in FIG. 5C.

Figure 5D:
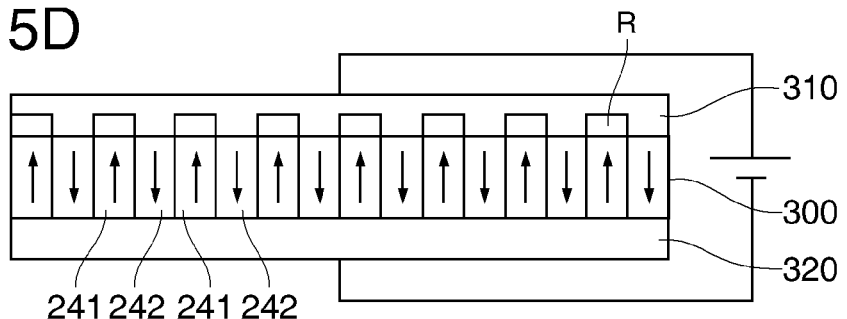

Predetermined voltage is applied between the electrode films 310 and 320 as shown in FIG. 5D. By applying electric field and changing the crystal structure, the portions of the wafer 300 not covered by the resist patterns R are converted into the inverted portions 242. The portions of the wafer 300 covered by the resist patterns R which have extremely low dielectric constant become the polarized portions 241 without change of crystal structure since electric field is not applied. Voltage applied between the electrode films 310 and 320 is sufficient voltage for changing crystal structure. When cross talk of electric field is caused in the substrate surface direction at the time of voltage application, the accuracy in shapes and positions of the inverted portions decreases. However, the inverted portions 242 become preferable ones due to the reduced thickness of the wafer 300.

Figure 5E:
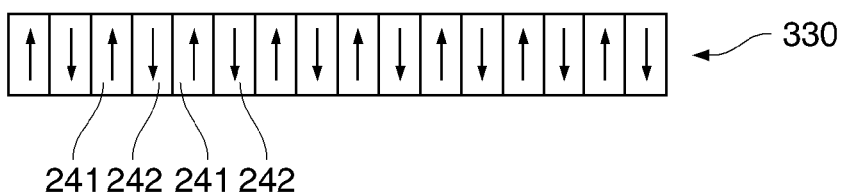

Then, the electrode films 310 and 320 and the resist patterns R are removed as shown in FIG. 5E such that the wafer 300 becomes an appropriate individual piece as a base material 330. The polarization inversion axis direction of the base material 330 corresponds to the direction of electric filed applied to the wafer 300, that is, the thickness direction of the wafer 300. Thus, the length of the base material 330 in the polarization inversion direction decreases as the accuracy in shapes and positions of the inverted portions 242 increases. On the other hand, the length of the base material 330 in the surface direction can be expanded according to the length and the degree of individualization of the wafer 300.

Figure 6A:
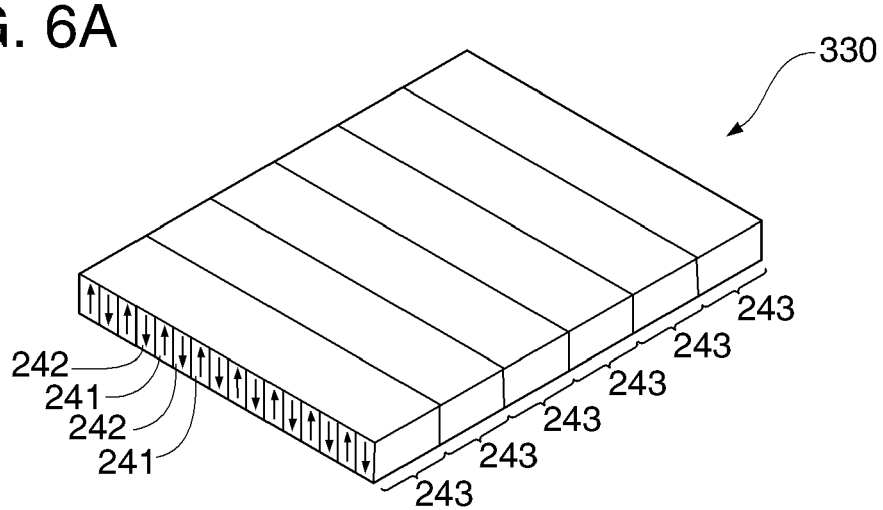
FIGS. 6A through 6C show steps performed after the step shown in FIG. 5E.

Next, the base material 330 is cut in the thickness direction along the cyclic direction as shown in FIG. 6A to obtain the wavelength conversion element pieces 243.

Figure 6B:
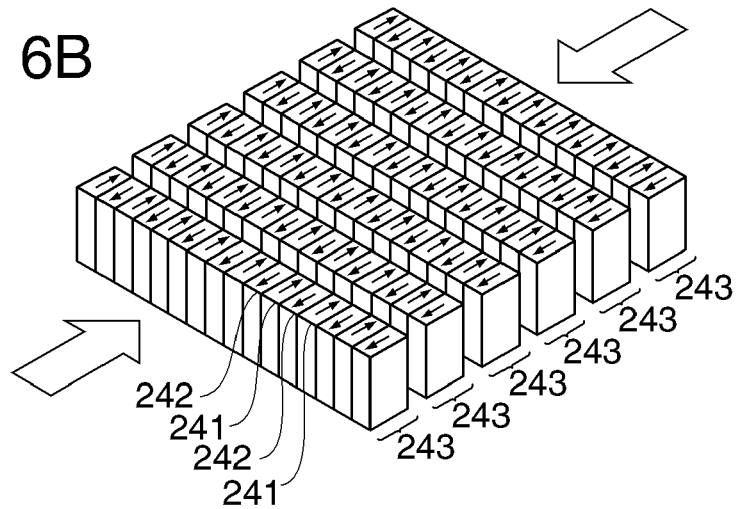

Then, the wavelength conversion element pieces 243 shown in FIG. 6A are rotated through 90° around a rotation axis along the cyclic direction as shown in FIG. 6B, for example, and aligned such that the polarization inversion axis directions of the plural wavelength conversion element pieces 243 can be equalized. After alignment, the wavelength conversion element pieces 243 are affixed to one another. The plural wavelength conversion element pieces 243 may be affixed via spacers, or reinforcing members may be attached to the outer sides of the wavelength conversion element pieces disposed at the outermost positions.

Finally, both end surfaces in the cyclic direction are polished in an appropriate manner to level the surfaces and equalize the lengths of the plural wavelength conversion element pieces 243 in the cyclic direction.

Figure 6C:
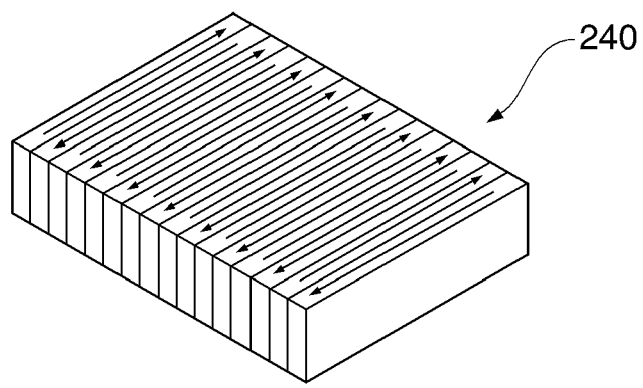

The wavelength conversion element 240 shown in FIG. 6C is thus produced by these processes.

According to the manufacturing method in this embodiment, the plural wavelength conversion element pieces are affixed to one another in the polarization inversion axis direction. Thus, the length of the wavelength conversion element 240 can be extended in the polarization inversion axis direction. The length of the wavelength conversion element in the cyclic direction and the length of the wavelength conversion element 240 in the direction orthogonal to the cyclic direction and orthogonal to the polarization inversion direction can be increased according to the dimensions of the base material 330 and the intervals for cutting the base material 330. Thus, the wavelength conversion element 240 obtains desired lengths in three directions orthogonal to one another, and limitation imposed on the number of laser beams to be received and positions for receiving laser beams is considerably reduced. Accordingly, the wavelength conversion element 240 becomes a preferable component having high degree of freedom for positioning.

In case of manufacture of the wavelength conversion element having spacers and reinforcing members, spacer forming materials to be formed into spacers may be attached before the wafer 300 having the polarized parts 241 and the inverted parts becomes an individual piece or before the base material is cut into pieces.

For example, after the polarized parts 241 and the inverted parts 242 are provided on the wafer 300, the spacer forming materials are attached to the surfaces of the wafer 300 orthogonal to the polarization inversion axis direction. This wafer may be the wafer 300 before the polarized parts 241 and the inverted parts 242 are provided thereon (see FIG. 5A) for example. Then, the spacer forming materials and the wafer 300 having the polarized parts 241 and the inverted parts 242 are collectively formed into an individual piece to produce a base material to which an assembly to be formed into spacers is affixed. This base material is cut into pieces to form a plurality of components having spacers and wavelength conversion element pieces attached thereto. The plural components are attached to one another to produce a wavelength conversion element to which the plural wavelength conversion element pieces are affixed via spacers. According to this method, the step for forming spacers and the step for forming wavelength conversion element pieces are collectively performed, and thus manufacturing efficiency improves. Moreover, the length in the cyclic direction and the length in the direction orthogonal to the cyclic direction and the polarization inversion axis direction agree between the spacers and the wavelength conversion element pieces by collectively cutting the base material 330 after the spacer forming materials and the wafer 300 are collectively individualized. Accordingly, the labor for controlling the lengths of the spacers and the wavelength conversion element pieces is eliminated, and thus the manufacturing efficiency improves.

When the assembly to be formed into spacers is attached to perform the subsequent steps before cut of the base material 330, the manufacturing efficiency similarly improves for similar reasons.

Fifth Embodiment

Figure 7A:
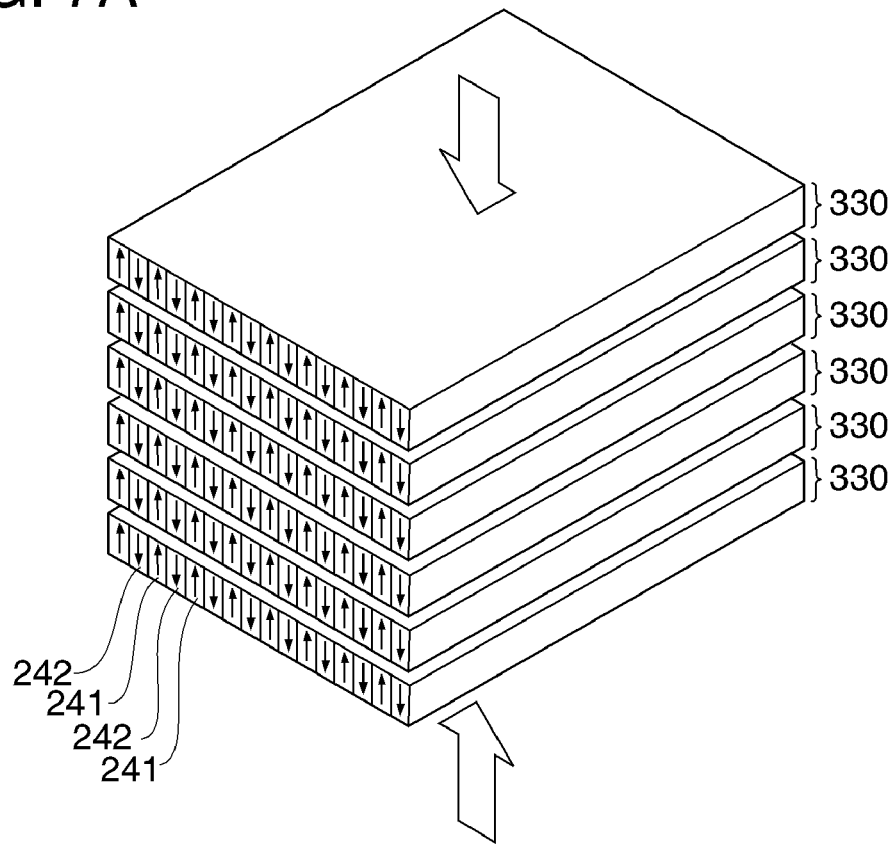
FIGS. 7A and 7B show steps of a manufacturing method according to a fifth embodiment.
Figure 7B:
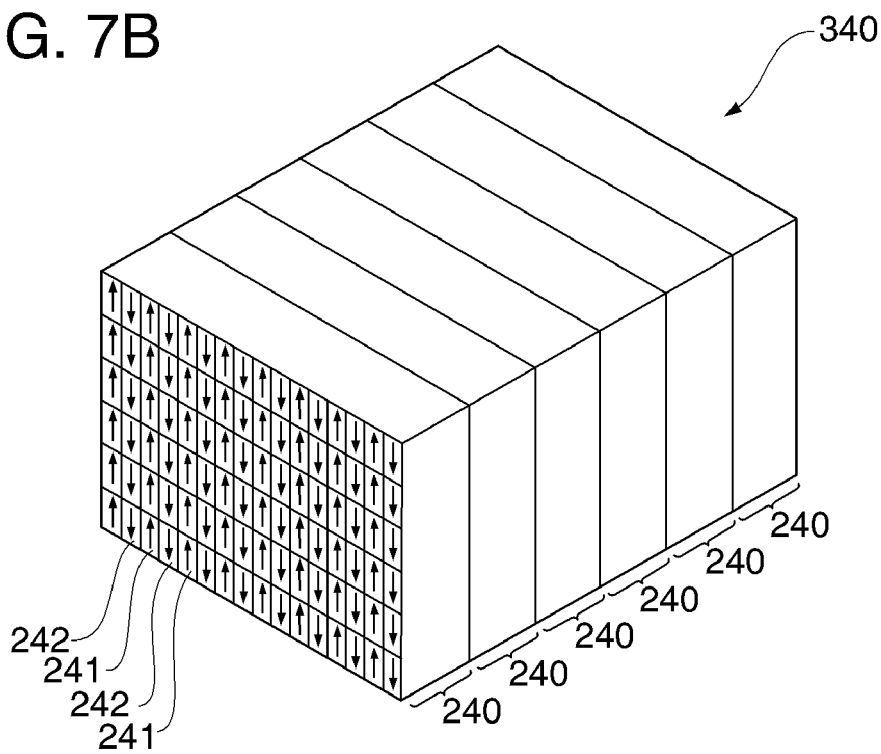

FIGS. 7A and 7B show manufacturing steps of the wavelength conversion element according to the fifth embodiment of the invention. The method for producing the wavelength conversion element 240 of the third embodiment is herein discussed. This embodiment is different from the fourth embodiment in that a structure formed by attaching a plurality of base materials is cut to produce the wavelength conversion elements.

Initially, the plural base materials 330 shown in FIG. 7A are prepared, and aligned and affixed to one another such that the respective polarization inversion axis directions and cyclic directions can be equalized. The base materials 330 may be manufactured materials available on the market, or may be formed individually. The method for forming the base materials 330 may be the method employed in the fourth embodiment (see FIGS. 5A through 5E). The base materials 330 may be the wafers 300 before individualization such as those having the polarized parts 241 and the inverted parts 242. By this step, a structure 340 constituted by the plural base materials 330 is produced. It is possible to attach the plural base materials 330 via the spacer forming materials or materials to be formed into reinforcing members to the outer sides of the base materials 330 disposed at the outermost positions.

Then, the structure 340 is cut in the thickness direction (polarization inversion axis direction) along the cyclic direction of the base materials 330 of the structure 340 as shown in FIG. 7B. By this step, the wavelength conversion elements 240 shown in FIG. 6C are produced. The wavelength conversion elements 240 shown in FIG. 6C correspond to the wavelength conversion elements 240 shown in FIG. 3 rotated through 90° around the rotation axis of the cyclic direction (X direction).

According to the manufacturing method in this embodiment, the plural base materials 330 are affixed to one another in the polarization inversion axis direction. Thus, the wavelength conversion element 240 obtains desired lengths in the three directions orthogonal to one another for the same reason as that of the fourth embodiment. Moreover, the plural wavelength conversion elements 240 are collectively manufactured according to the cutting number of the structure 340. Thus, the preferable wavelength conversion element 240 having high degree of freedom for positioning can be produced with high efficiency.

The positional errors in affixing the plural base materials 330 are considered to be similar to positional errors in attaching the wavelength conversion element pieces 243 in the fourth embodiment. Since the length of the base material 330 is larger than the length of the wavelength conversion element piece 243, the positional errors between the wavelength conversion element pieces 243 are smaller in the fourth embodiment.

Figure 8:
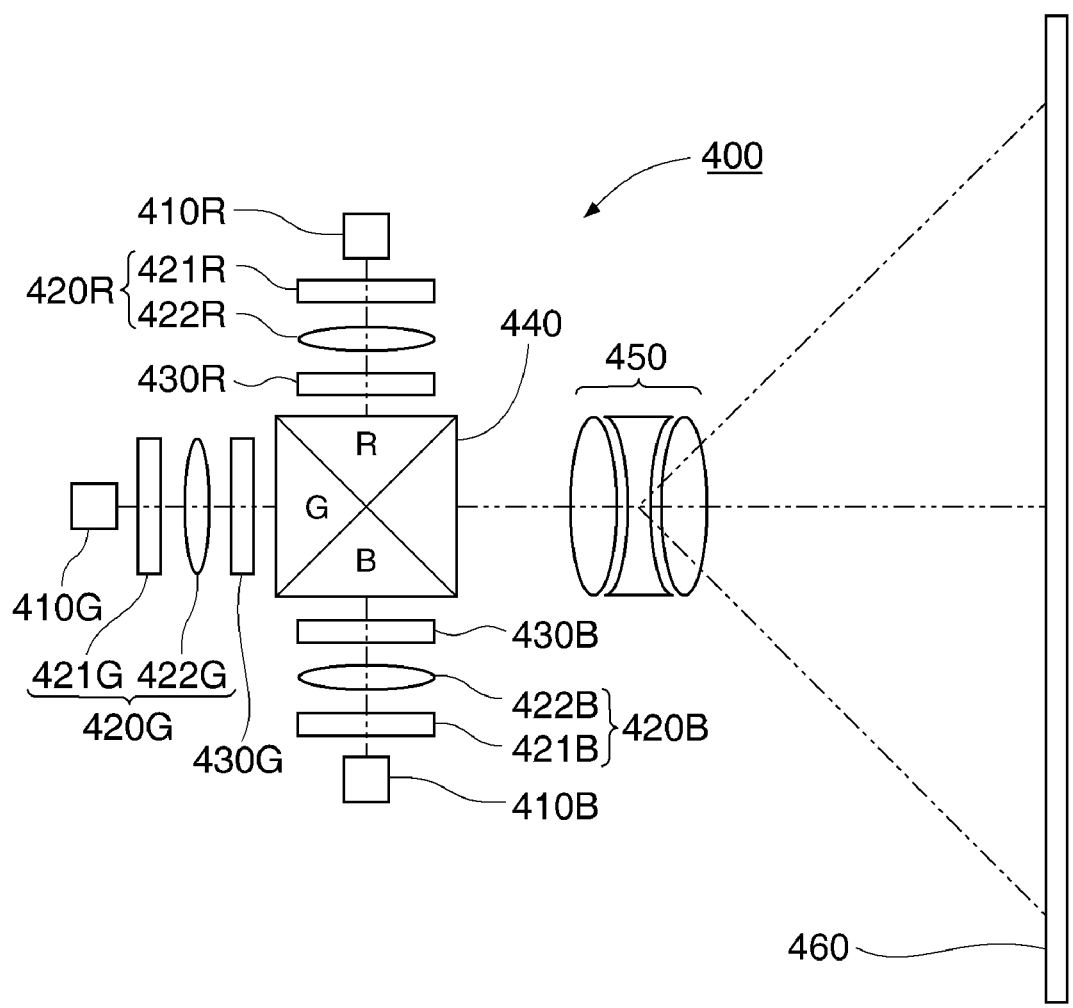
FIG. 8 illustrates a general structure of a projector.

A projector as an example of the invention is now described. FIG. 8 illustrates a general structure of a projector 400 in this example. As illustrated in FIG. 8, the projector 400 includes laser source devices 410R, 410G, and 410B, transmission type liquid crystal light valves (light modulation devices) 430R, 430G, and 430B, a cross dichroic prism 440, and a projection device 450. The laser source devices 410R, 410G, and 410B emit red light, green light, and blue light, respectively. The respective color lights emitted from these devices are modulated by the liquid crystal light valves 430R, 430G, and 430B. The modulated color lights are combined by the dichroic prism 440, and the combined light is projected from the projection device 450.

The projector 400 in this embodiment further includes equalizing systems 420R, 420G, and 420B for equalizing illumination distributions of laser beams emitted from the laser source devices 410R, 410G, and 410B. The liquid crystal light valves 430R, 430G, and 430B receive lights having equalized illumination distributions. In this example, the equalizing system 420R has a hologram 421R, a field lens 422R, and other components, and the equalizing systems 420G and 420B have similar structures.

The respective color lights modulated by the liquid crystal light valves 430R, 430G, and 430B enter the cross dichroic prism 440. The cross dichroic prism 440 is formed by affixing four rectangular prisms, and contains dielectric multilayer film for reflecting red light and dielectric multilayer film for reflecting blue light disposed in a cross shape on the inner surface of the cross dichroic prism 440. The three color lights are combined into light representing a color image by using the dielectric multilayer films. The combined light is enlarged and projected on a screen 460 by using the projection device 450 such that a projection image can be displayed on the screen 460.

The projector 400 in this example which includes the laser source devices 410R, 410G, and 410B constituted by the laser source devices of the invention has a wide dynamic range, and thus provides high-quality projection images. Since the laser source devices 410R, 410G, and 410B have high efficiency, power consumption of the projector 400 is small.

While the transmission type liquid crystal light valves are used as the light modulation devices in this example, reflection type light valves or light modulation devices other than liquid crystal type may be used. Examples of these light valves include reflection type liquid crystal light valves and digital mirror device (DMD). The structure of the projection system may be varied according to the types of light valves used. While the cross dichroic prism is used as the color light combining unit in this example, other types of color light combining unit such as the type which combines color lights by using dichroic mirrors disposed in cross shape and the type which combines color lights by using dichroic mirrors disposed in parallel may be used.

Figure 9:
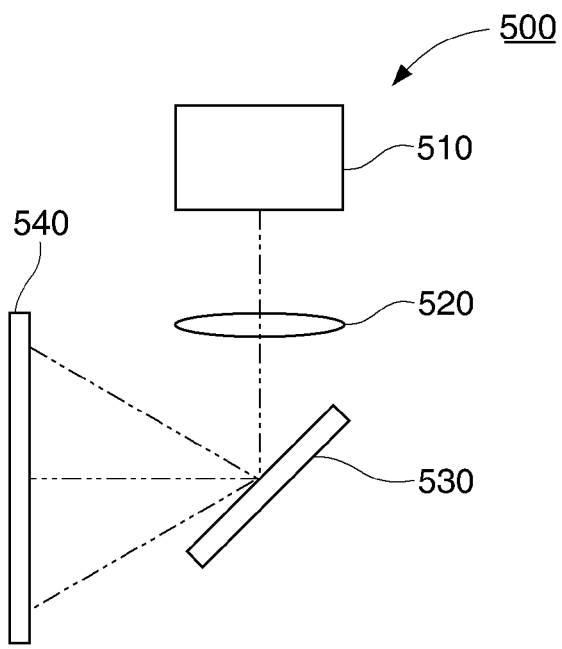
FIG. 9 illustrates a general structure of a scanning-type projector.

A projector according to another example of the invention is now described. The projector in this example is different from the projector in the above example in that the projector is a scanning-type projector. FIG. 9 illustrates a general structure of the scanning-type projector in this example.

A scanning-type projector 500 in this example includes a laser source device 510, a converging lens 520, and an MEMS mirror (light modulation device, projection device) 530. Laser beam emitted from the laser source device 510 is converged at the MEMS mirror 530 by the converging lens 520. The laser beam thus converged is modulated by the MEMS mirror 530, and supplied to a screen 540 for scanning in the horizontal direction and vertical direction by actuation of the MEMS mirror 530. By this method, images are displayed on the screen 540.

Figure 10:
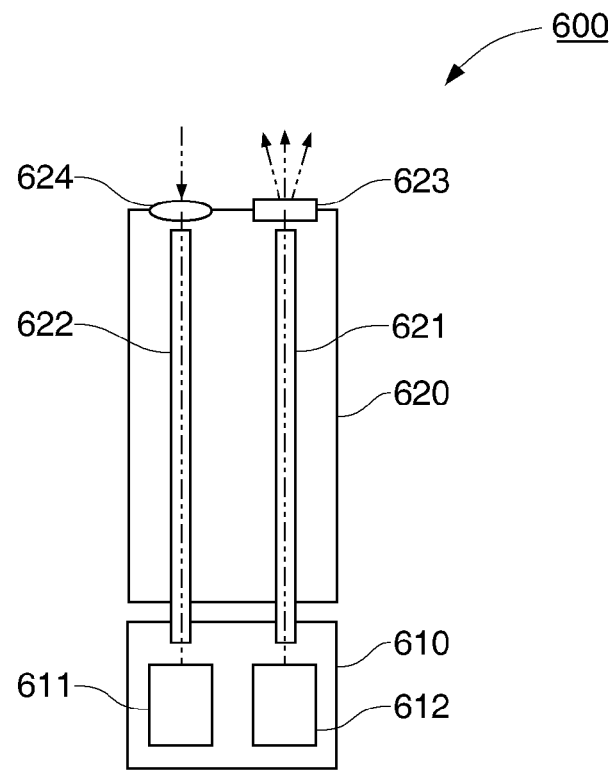
FIG. 10 illustrates a general structure of a monitoring device.

A monitoring device as an example of the invention is now described. FIG. 10 illustrates a general structure of the monitoring device in this example. A monitoring device 600 in this example includes a device main body 610 and a light transmission unit 620. The device main body 610 includes a camera (image pickup device) 611 and a laser source device 612 according to the invention. The light transmission unit 620 has a light guide 621 for supplying light and a light guide 622 for receiving light. Each of the light guides 621 and 622 contains a number of optical fibers to send laser beams to a distant place. A diffusion plate 623 is provided at one end (distal end) of the illumination light guide 621 on the light emission side, and the other end is connected with the laser source device 612. Laser beam emitted from the laser source device 612 is supplied to the diffusion plate 623 via the light guide 621, and diffused by the diffusion plate 623 to illuminate a subject.

An image forming lens 624 is provided at the end of the light transmission unit 620. Light reflected by the surface of the subject enters the image forming lens 624. The light having entered the image forming lens 624 is supplied to the camera 611 provided within the device main body 610 via the light guide 622 for receiving light. Thus, laser beam emitted from the laser source device 612 illuminates the subject, and the light reflected by the surface of the subject is shot by the camera 611.

According to the monitoring device 600 in this example, the laser source device 612 of the invention is used to supply high-output laser beams to the subject. Accordingly, a sufficient amount of light reflected by the surface of the subject is secured, and thus the monitoring device becomes a preferable device capable of obtaining clear shot images. Since the laser source device having high efficiency is used, the power consumption of the monitoring device can be reduced.

The entire disclosure of Japanese Patent Application No. 2008-176244, filed Jul. 4, 2008 is expressly incorporated by reference herein.

What is claimed is:

1. A laser source device comprising:
   a light emission unit which emits laser beam having first wavelength;
   a first mirror which selectively reflects S-polarized light contained in the first wavelength laser beam emitted from the light emission unit in a direction different from the direction toward the light emission unit and transmits second wavelength laser beam;

a second mirror which receives laser beam reflected by the first mirror and reflects laser beam having first wavelength and contained in the received laser beam toward the first mirror; and a wavelength conversion element disposed between the first mirror and the second mirror and converts at least a part of S-polarized light with respect to the first mirror contained in the received first wavelength laser beam into laser beam having second wavelength, wherein:

the wavelength conversion element includes a plurality of wavelength conversion element pieces having polarization inversion axis and containing cyclic polarization inverted structure in a cyclic direction orthogonal to the polarization inversion axis, the wavelength conversion element pieces being affixed to one another in a direction along the polarization inversion axis; and the polarization inversion axis is disposed parallel with the oscillation direction of the S-polarized light.

2. The laser source device according to claim 1, wherein:

the first mirror, the second mirror, and the wavelength conversion element are provided as common units for a plurality of the arranged light emission units; and the optical axis directions of laser beams emitted from the plural light emission units are disposed parallel with the surface of the first mirror.

3. The laser source device according to claim 1, wherein the wavelength conversion element is produced by affixing the plural wavelength conversion element pieces to one another via spacers.

4. The laser source device according to claim 3, wherein:

the linear expansion coefficient of the plural wavelength conversion element pieces of the wavelength conversion element is substantially equal to the linear expansion coefficient of the spacers of the wavelength conversion element; and the thermal conductivity of the spacers is equal to or larger than the thermal conductivity of the plural wavelength conversion element pieces.

5. The laser source device according to claim 3, wherein the spacers are made of the same material as that of the plural wavelength conversion element pieces.

6. The laser source device according to claim 1, wherein:

a reinforcing member is provided on the outer side of the wavelength conversion element piece disposed at the outermost position in the polarization inversion axis direction; and the surfaces of the plural wavelength conversion element pieces orthogonal to the cyclic direction and the surface of the reinforcing member orthogonal to the cyclic direction are collectively polished.

7. A projector comprising:

the laser source device according to claim 1;

a light modulation device which modulates laser beam emitted from the laser source device; and a projection device which projects laser beam modulated by the light modulation device.

8. A monitoring device comprising:

the laser source device according to claim 1; and an image pickup device which obtains an image of a subject illuminated by the laser source device.

* * * * *